(12) United States Patent
Hung et al.

(10) Patent No.: US 8,796,545 B2
(45) Date of Patent: Aug. 5, 2014

(54) DYE-SENSITIZED SOLAR CELL, ITS PHOTOELECTRODE AND PRODUCING METHOD THEREOF

(71) Applicant: I-Shou University, Kaohsiung (TW)

(72) Inventors: Tien-Tsan Hung, Kaohsiung (TW); Jun-Yu Bai, Kaohsiung (TW)

(73) Assignee: I-Shou University, Kaohsiung (TW)

( * ) Notice: Subject to any disclaimer, the term of this patent is extended or adjusted under 35 U.S.C. 154(b) by 7 days.

(21) Appl. No.: 13/684,312

(22) Filed: Nov. 23, 2012

(65) Prior Publication Data

US 2014/0060637 A1 Mar. 6, 2014

(30) Foreign Application Priority Data

Aug. 31, 2012 (TW) .............. 101131793 A

(51) Int. Cl.
*H01L 31/00* (2006.01)
*H01L 31/18* (2006.01)
*H01L 31/0224* (2006.01)
*B82Y 20/00* (2011.01)

(52) U.S. Cl.
CPC .... *H01L 31/022425* (2013.01); *H01L 31/1884* (2013.01); *B82Y 20/00* (2013.01)
USPC ...................................................... 136/263

(58) Field of Classification Search
CPC . H01G 9/2022; H01G 9/2031; H01G 9/2027; H01G 9/2036; H01G 9/204; H01G 9/048
USPC ................................ 136/256, 263
See application file for complete search history.

(56) References Cited

U.S. PATENT DOCUMENTS

| 2007/0209696 A1* | 9/2007 | Duerr et al. .................... 136/252 |
| 2010/0300516 A1* | 12/2010 | Miyazawa ..................... 136/254 |
| 2011/0030770 A1 | 2/2011 | Sreenivasan et al. |
| 2013/0074913 A1* | 3/2013 | Leung et al. ................... 136/256 |

FOREIGN PATENT DOCUMENTS

TW M403755 5/2011

* cited by examiner

*Primary Examiner* — Jonathan Johnson
*Assistant Examiner* — Angelo Trivisonno
(74) *Attorney, Agent, or Firm* — Muncy, Geissler, Olds & Lowe, P.C.

(57) ABSTRACT

A dye-sensitized solar cell includes a negative electrode, a positive electrode, a photoelectrode mounted between the negative electrode and the positive electrode, and an electrolyte located between the photoelectrode and the positive electrode. The photoelectrode is adapted to absorb a dye. The photoelectrode includes a dense layer, a scattering layer and a carrier transport layer. The dense layer, the scattering layer and the carrier transport layer are stacked one upon another. The dense layer is formed by titanium dioxide nanoparticles having a diameter of 15-20 nm. The scattering layer is formed by titanium dioxide nanospheres having a diameter of 200-500 nm. The carrier transport layer is formed by titanium dioxide nanotubes having a length of 300-800 nm. Furthermore, a photoelectrode for the dye-sensitized solar cell, as well as a method for producing the photoelectrode, are also disclosed.

11 Claims, 4 Drawing Sheets

DYE-SENSITIZED SOLAR CELL, ITS PHOTOELECTRODE AND PRODUCING METHOD THEREOF

BACKGROUND OF THE INVENTION

1. Field of the Invention

The present invention generally relates to a dye-sensitized solar cell and, more particularly, to a dye-sensitized solar cell including a photoelectrode with three layers of nanostructure of different types and a method for producing the photoelectrode.

2. Description of the Related Art

Dye-sensitized solar cells have advantages such as low material cost and simple manufacturing process. Furthermore, dye-sensitized solar cells are flexible and light-permeable and contain multiple colors after formation. Due to the above advantages, dye-sensitized solar cells show enormous business potential and have been widely used in most of industries in recent years.

A dye-sensitized solar cell is mainly composed of a transparent conductive board, a photoelectrode, a dye, an electrolyte and a counter electrode. The dye is absorbed by the photoelectrode. Electrons are excited after the dye absorbs photons. The electrons are injected into a conduction band of the photoelectrode during a transfer process. The photoelectrode becomes charged and produces electricity during the transfer of the electrons. Therefore, the electron transfer rate between the photoelectrode and the dye is an important factor to the photoelectric conversion efficiency of the dye-sensitized solar cells. In light of this, it has been an important goal to improve the photoelectrode in the industry.

Taiwan Utility Model No. M403755 discloses a titanium dioxide photoanode with multiple layers of nanoscale thin films for a dye-sensitized solar ell. A hydrothermal process and arc process are used to produce the multilayer titanium dioxide photoanode with different types of nanoparticles (H200, Tnt-C550, and SF) to improve the light absorption efficiency of the photoanode as well as increasing the photoelectric conversion efficiency of the dye sensitized solar cell. The H200 nanoparticles have an average diameter of 20 nm, the Tnt-C550 nanoparticles have an average diameter of 25 nm, and the SF nanoparticles are in the form of needles and have an average diameter of 35 nm.

Although the light absorption effect of the conventional photoanode can be improved by the multiple layers of thin films, the conventional single film is simply replaced by the H200, Tnt-C550 and SF nanoparticles to properly adjust the light absorption and scattering effects via the differences in diameter of the nanoparticles among individual layers. However, each of the H200, Tnt-C550, and SF layers does not provide any other function, and the improvement of light absorption and scattering is limited. Even if the light absorption effect is improved, the electrons transfer rate in the photoanode can not be increased. Thus, the photoanode can not provide significant improvement in the photoelectric conversion efficiency.

Furthermore, in addition to the hydrothermal process and arc process for producing Tnt-C550 nanoparticles and H200 nanoparticles, vacuum submerged arc process is required to produce SF nanoparticles in the approach of using three different nanoparticles to form the photoanode. The processing procedures of the hydrothermal process and the vacuum submersed arc process are complicated and time-consuming, not allowing continuous mass production. Furthermore, the fitness between the Tnt-C550 nanoparticles, H200 nanoparticles, and SF nanoparticles could be adversely affected by uneven contact surfaces due to different diameters while stacking these particles to form the thin films. The quality of the resultant photoanode and the photoelectric conversion efficiency are, thus, not good.

Thus, a need exists for a novel photoelectrode for use in a dye-sensitized solar cell to solve the above problems.

SUMMARY OF THE INVENTION

An objective of the present invention is to provide a dye-sensitized solar cell providing improved photoelectric conversion efficiency.

Another objective of the present invention is to provide a dye-sensitized solar cell providing increased light source utility rate, inhibiting generation of dark current, and increasing the carrier mobility.

A further objective of the present invention is to provide a dye-sensitized solar cell allowing simplified procedures to reduce the work hours and cost while allowing continuous mass production.

Still another objective of the present invention is to provide a dye-sensitized solar cell, providing increased fitness between films to maintain the quality and photoelectric conversion efficiency of the photoelectrode.

The present invention fulfills the above objective by providing, in a first aspect, a dye-sensitized solar cell including a negative electrode, a positive electrode, a photoelectrode mounted between the negative electrode and the positive electrode, and an electrolyte located between the photoelectrode and the positive electrode. The photoelectrode is adapted to absorb a dye. The photoelectrode includes a dense layer, a scattering layer and a carrier transport layer. The dense layer, the scattering layer and the carrier transport layer are stacked one upon another. The dense layer is formed by titanium dioxide nanoparticles having a diameter of 15-20 nm. The scattering layer is formed by titanium dioxide nanospheres having a diameter of 200-500 nm. The carrier transport layer is formed by titanium dioxide nanotubes having a length of 300-800 nm.

In an example, the scattering layer is located between the dense layer and the carrier transport layer, and the dense layer is located on the negative electrode. In another example, the carrier transport layer is located between the dense layer and the scattering layer, and the dense layer is located on the negative electrode.

Preferably, the dense layer of the photoelectrode has a thickness of 3-6 µm.

Preferably, the scattering layer of the photoelectrode has a thickness of 8-11 µm.

Preferably, the carrier transport layer of the photoelectrode has a thickness of 5-8 µm.

In a second aspect of the present invention, a photoelectrode for a dye-sensitized solar cell includes a dense layer, a scattering layer and a carrier transport layer. The dense layer, the scattering layer and the carrier transport layer are stacked one upon another. The dense layer is formed by titanium dioxide nanoparticles having a diameter of 15-20 nm. The scattering layer is formed by titanium dioxide nanoballs having a diameter of 200-500 nm. The carrier transport layer is formed by titanium dioxide nanotubes having a length of 300-800 nm.

In an example, the scattering layer is located between the dense layer and the carrier transport layer, and the dense layer is located on the negative electrode. In another example, the carrier transport layer is located, between the dense layer and the scattering layer, and the dense layer located on the negative electrode.

Preferably, the dense layer of the photoelectrode has a thickness of 3-6 μm.

Preferably, the scattering layer of the photoelectrode has a thickness of 8-11 μm.

Preferably, the carrier transport layer of the photoelectrode has a thickness of 5-8 μm.

In a third aspect of the present invention, a method for producing a photoelectrode for a dye-sensitized solar cell includes respectively mixing powders of titanium dioxide nanoparticles having a diameter of 15-20 nm, powders of titanium dioxide nanospheres having a diameter of 200-500 nm, and powders of titanium dioxide nanotubes having a length of 300-800 nm in a solvent. A binder is added into the solvent to make the powders of titanium dioxide nanoparticles, the powders of titanium dioxide nanospheres, and the powders of titanium dioxide nanotubes respectively and homogenously mix with the solvent, forming a particle-shaped paste, a sphere-shaped paste, and a tube-shaped paste, respectively. The particle-shaped paste, the sphere-shaped paste and the tube-shaped paste respectively form a dense layer, a scattering layer and a carrier transfer layer. The dense layer, the scattering layer and the carrier transport layer are stacked on a substrate to form a photoelectrode.

Preferably, the binder is polyethylene glycol.

Preferably, a weight percentage of the polyethylene glycol is 40% of one of the powders of titanium dioxide nanoparticles, the powders of titanium dioxide nanospheres, and the powders of titanium dioxide nanotubes.

Preferably, the powders of titanium dioxide nanoparticles having a diameter of 15-20 nm, the powders of titanium dioxide nanospheres having a diameter of 200-500 nm, and the powders of titanium dioxide nanotubes having a length of 300-800 nm are respectively made by a hydrothermal process.

Preferably, the dense layer, the scattering layer and the carrier transport layer are stacked on the substrate by a doctor blade method.

The present invention will become clearer in light of the following detailed description of illustrative embodiments of this invention described in connection with the drawings.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

All figures are drawn for ease of explanation of the basic teachings of the present invention only; the extensions of the figures with respect number, position, relationship, and dimensions of the parts to form the preferred embodiments will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

DETAILED DESCRIPTION OF THE INVENTION

Figure 1:
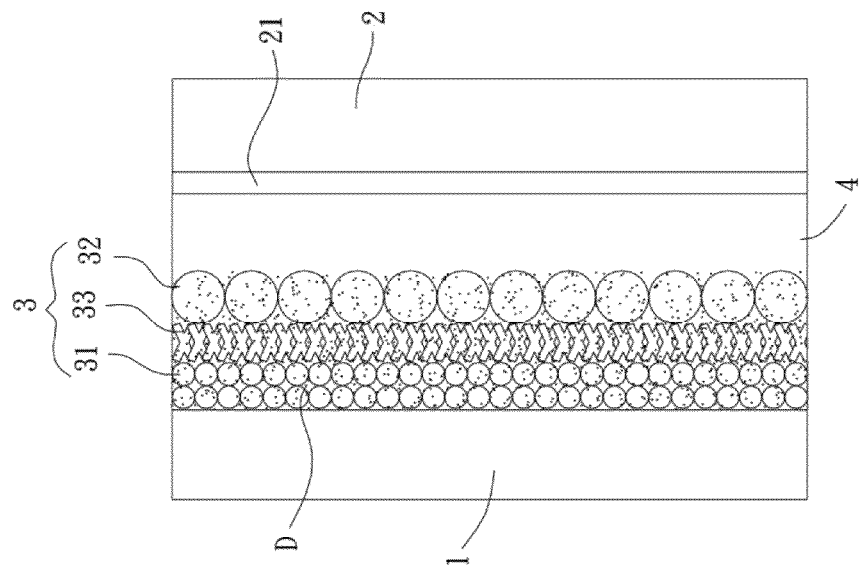
FIG. 1 is a schematic view illustrating a structure of a dye-sensitized solar cell according to the present invention.
Figure 2:
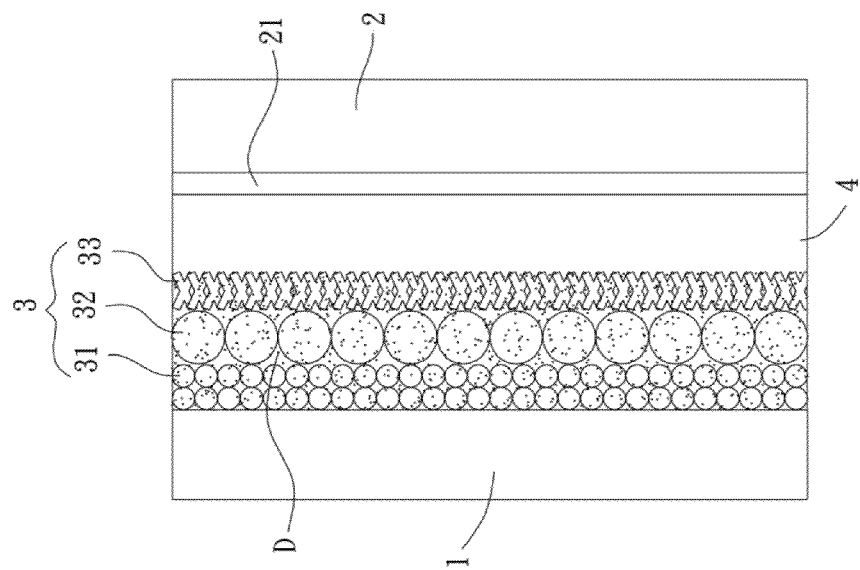
FIG. 2 is a schematic view illustrating another structure of the dye-sensitized solar cell according to the present invention.

With reference to FIGS. 1 and 2, a dye-sensitized solar cell according to the present invention includes a negative electrode 1, a positive electrode 2, a photoelectrode 3, and an electrolyte 4. The photoelectrode 3 is located between the negative electrode 1 and the positive electrode 2. The electrolyte 4 is located between the photoelectrode 3 and the positive electrode 2.

The negative electrode 1 can be a glass substrate, a flexible substrate, or a thin film substrate coated with a transparent conductive film. In this embodiment, the negative electrode 1 is a thin film substrate coated with fluorine-doped tin oxide (FTO). Desired replacement can be made by one skilled in the art. Since this is not the main feature of the present invention, detailed description is not set forth to avoid redundancy.

The positive electrode 2 is mounted opposite to the negative electrode 1. Likewise, the positive electrode 2 can be a glass substrate, a flexible substrate, or a thin film substrate coated with a transparent conductive film, allowing transfer of electrons. Desired replacement can be made by one skilled in the art. Since this is not the main feature of the present invention, detailed description is not set forth to avoid redundancy. Nevertheless, a catalyst layer 21 is bonded to a surface of the positive electrode 2 facing the negative electrode 1 and located between the positive electrode 2 and the electrolyte 4 to accelerate oxidation/reduction reaction. In this embodiment, the catalyst layer 21 is preferably a film formed by stacking nanoparticles of platinum.

The photoelectrode 3 can be made of a semiconductive material to absorb a dye D. The dye D is a composition of ruthenium complex. When a light source passes through the photoelectrode 3 and scatters, the dye D absorbs photons, and electrons are in an excited state. In this embodiment, the photoelectrode 3 is formed by three different types of titanium dioxides and includes a dense layer 31, a scattering layer 32, and a carrier transport layer 33 that are stacked one upon another. The stacking relation or sequence between the dense layer 31, the scattering layer 32, and the carrier transport layer 33 is not limited. As an example, the dense layer 31, the scattering layer 32, and the carrier transport layer 33 can be stacked in sequence, with the scattering layer 32 located between the dense layer 31 and the carrier transport layer 33, with the dense layer 31 located on the negative electrode 1, as shown in FIG. 1. As another example, the dense layer 31, the carrier transport layer 33, and the scattering layer 32 can be stacked in sequence, with the carrier transport layer 33 located between the dense layer 31 and the scattering layer 32, with the dense layer 31 located on the negative electrode 1, as shown in FIG. 2. The photoelectric conversion efficiency of the dye-sensitized solar cell according to the present invention can be improved through the differences of forms between these layers and can be proved by the following description and experiments.

The dense layer 31 is formed by titanium dioxide nanoparticles having a diameter of 15-20 nm. Due to compact arrangement among the titanium dioxide nanoparticles, only tiny gaps exist in the dense layer 31, preventing generation of dark current. The dense layer 31 can have a thickness of 3-6 μm. The scattering layer 32 is formed by titanium dioxide nanospheres having a diameter of 200-500 nm. The titanium dioxide nanospheres have larger contact areas with the light source. Thus, the scattering layer 32 can fully absorb the sunlight and produce a light scattering effect. The scattering layer 32 can have a thickness of 8-11 μm. The carrier transport layer 33 is formed by titanium dioxide nanotubes having a length of 300-800 nm. The titanium dioxide nanotubes intersect with one another and form numerous tiny slits. The one-dimension pattern presented by the tiny slits and the shapes of the titanium dioxide nanotubes not only increases the infiltrability of the carrier transport layer 33 but assists in transport electrons. The carrier transport layer 33 can have a thickness of 5-8 μm.

Still referring to FIGS. 1 and 2, the electrolyte 4 is a liquid electrolyte or gel electrolyte, which can be appreciated by one skilled in the art. As an example, the electrolyte 4 can include iodine ions and iodine complex ions. Since this is not the main feature of the present invention, detailed description is not set forth to avoid redundancy.

In actual use of the dye-sensitized solar cell according to the present invention, when the dye D that is absorbed in the photoelectrode 3 absorbs the energy of photons, the scattering layer 32 of the photoelectrode 3 provides a better light scattering effect of the light source and forces the dye D to fully absorb the energy of photons, turning the molecules of the dye D from the ground state into the excited state. Furthermore, when the dye D in the excited state transfers electrons, the carrier transport layer 33 of the photoelectrode 3 speeds up the transport of electrons to rapidly inject the electrons into the conduction band of the photoelectrode 3 such that the photoelectrode 3 is fully charged. After the electrons pass through the dense layer 31 of the photoelectrode 3 and flow towards the negative electrode 1, the dense layer 31 avoids the electron from flowing into the electrolyte 4 in the reverse direction, avoiding generation of dark current. Finally, the electrons pass through an external loop and are guided to the positive electrode 2, forming a cycle and generating photocurrent. The dye D returns to the ground state after the lost electrons are compensated by the electrolyte 4. The procedures of light-to-current conversion repeat.

To prove the photoelectrode 3 of the dye-sensitized solar cell according to the present invention indeed possesses the above effects, tests of photon-to-electron efficiency were made on dye-sensitized solar cells including the photoelectrodes 3. The photoelectrodes 3 were made according to the methods set forth hereinafter.

Powders of titanium dioxide nanoparticles having a diameter of 15-20 nm, powders of titanium dioxide nanospheres having a diameter of 200-500 nm, and powders of titanium dioxide nanotubes having a length of 300-800 nm were respectively mixed in a solvent. A binder was added into the solvent to make the powders of titanium dioxide nanoparticles, the powders of titanium dioxide nanospheres, and the powders of titanium dioxide nanotubes respectively and homogenously mix with the solvent, forming a particle-shaped paste, a ball-shaped paste, and a tube-shaped paste, respectively. The particle-shaped paste, the sphere-shaped paste, and the tube-shaped paste respectively formed a dense layer, a scattering layer, and a carrier transport layer. The dense layer, the scattering layer, and the carrier transport layer were stacked on a substrate to form a photoelectrode. Particularly, the stacking relation between the dense layer, the scattering layer, and the carrier transport layer can be changed according to the situations. Preferably, the particle-shaped paste, the tube-shaped paste, and the sphere-shaped paste are coated on the substrate in sequence and then calcined and baked to form the dense layer, the carrier transport layer, and the scattering layer on the substrate in sequence, improving the photoelectric transfer efficiency.

The binder can be polyethylene glycol (PEG) or the like. The binder can reduce aggregation among the powders, increasing the film-forming property and adhesion of the paste. The paste forms a porous film structure after sintering, which is advantageous to absorption of the dye.

Figure 3A:
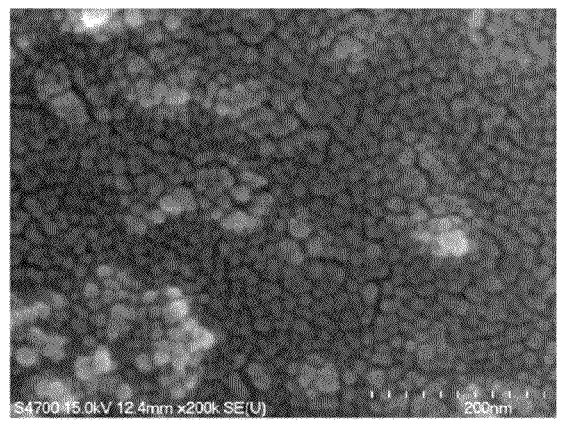
FIGS. 3A-3C are images of titanium dioxides of different forms produced according to present invention.
Figure 3B:
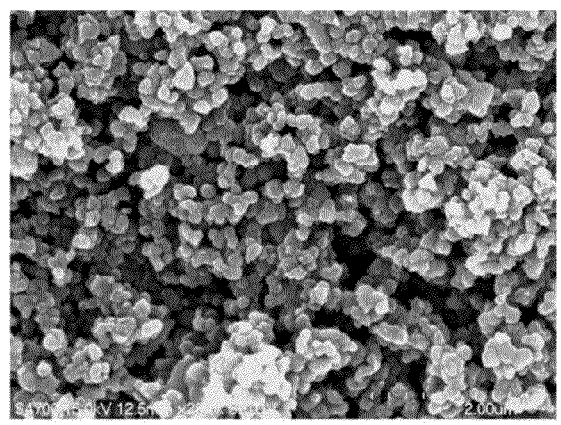
Figure 3C:
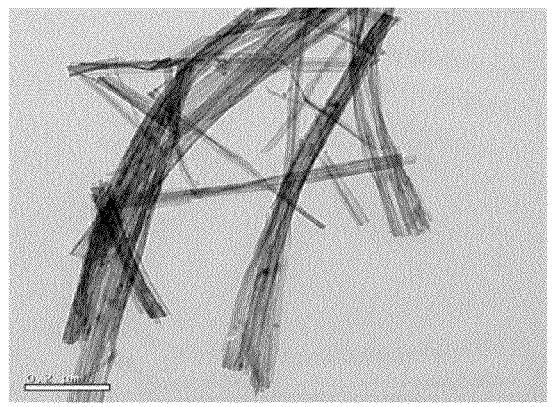

As an example, in this embodiment, powders of titanium dioxide nanoparticles having a diameter of 15-20 nm (hereinafter referred to as "NP20", see FIG. 3A), powders of titanium dioxide nanospheres having a diameter of 200-500 nm (hereinafter referred to as "NS", see FIG. 3B), and the powders of titanium dioxide nanotubes having a length of 300-800 nm (hereinafter referred to as "NT", see FIG. 3C) were produced by the hydrothermal process. About 1.3 g of NP20, 1.3 g of NS, and 1.3 g of NT were respectively added into secondary water of about 8.7 ml and stirred for 30 minutes. About 0.52 g of PEG (about 40% of the weight of the titanium dioxide powders) was added into each of the three mixtures and stirred for 24 hours until the titanium dioxide powders of NP20, NS, and NT became homogenous, obtaining the particle-shaped paste, the sphere-shaped paste, and the tube-shaped paste.

According to the different stacking sequence, a doctor blade method was used in the procedures in the following examples to form the photoelectrodes according to the present invention under a working area of 0.25 cm$^2$.

Example 1

NP20/NS/NT

Figure 4A:
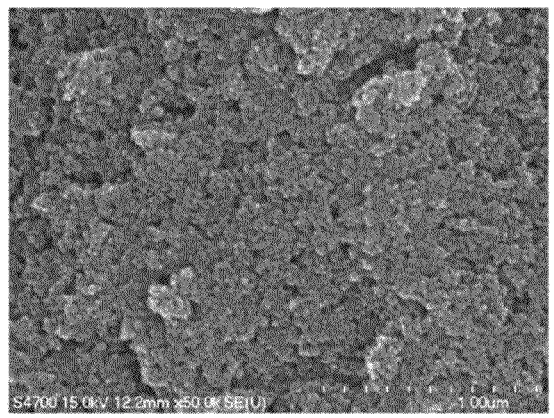
FIGS. 4A-4C are images of surfaces of different film layers of a photoelectrode according to the present invention.
Figure 4B:
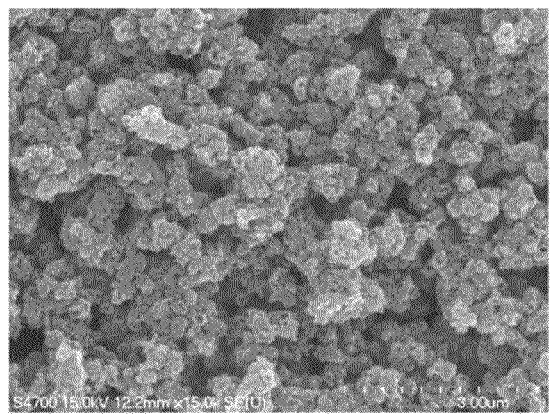
Figure 4C:
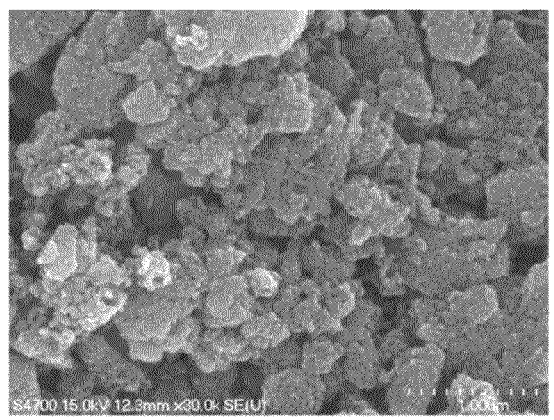
Figure 5:
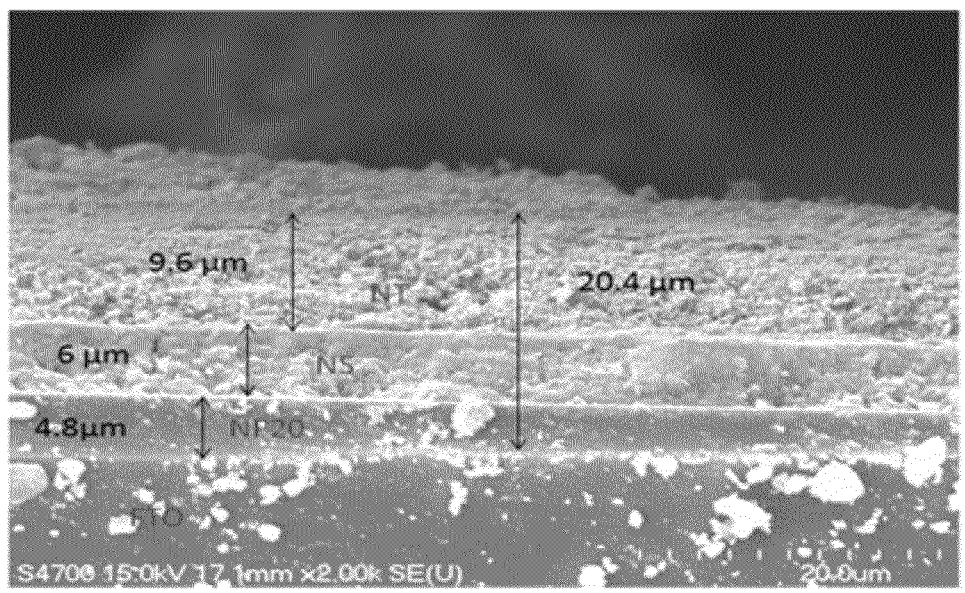
FIG. 5 shows an image of a cross section of the photoelectrode according to the present invention.

The particle-shaped paste (NP20) was applied to a substrate coated with fluorine-doped tin oxide and dried at 80° C. for 30 minutes. The substrate was then placed in a calciner and heated to 450° C. and remained at this temperature for 30 minutes, with the temperature increasing rate of the calciner controlled to be 10° C./min. After cooling to the room temperature, a layer of NP20 (the dense layer 31, FIG. 4A shows its surface pattern) having a thickness of about 4.8 μm was formed on a surface of the substrate. The sphere-shaped plating liquid (NS) was coated on the layer of NP20 and dried at the room temperature. Then, multi-stage calcination was carried out, with the temperature increasing rate of the calciner controlled to be 5° C./min. The calciner remained at 100° C. for 15 minutes, remained at 150° C. for 15 minutes, and remained at 450° C. for 30 minutes. After cooling to the room temperature, a layer of NP (the scattering layer 32, FIG. 4B shows its surface pattern) having a thickness of about 6.0 μm was formed on a face of the layer of NP20. Lastly, the tube-shaped plating liquid (NT) was coated on the layer of NS for carrying out the above procedures. After the multi-stage calcination and cooling, a layer of NT (the carrier transfer layer 33. FIG. 4C shows its surface pattern) having a thickness of about 9.6 μm was formed on a face of the layer of NS. Thus, a photoelectrode formed by NP20/NS/NT shown in FIG. 5 was stacked on the substrate and had an overall thickness of about 20.4 μm.

Example 2

NP20/NT/NS

The production procedures of example 1 were carried out, with the stacking relation changed to produce a photoelectrode formed by NP20/NT/NS on the substrate. Detailed description is not set forth to avoid redundancy

Example 3

NT/NP20/NS

The production procedures of example 1 were carried out, with the stacking relation changed to produce a photoelectrode formed by NT/NP20/NS on the substrate. Detailed description is not set forth to avoid redundancy.

In addition to the above three examples of NP20/NS/NT, NP20/NT/NS, and NT/NP20/NS, two-layer photoelectrodes formed by NP20/NS and NP20/NT and a photoelectrode formed by a single layer of NP20 were made and served as comparative examples for comparison with examples 1, 2, and 3.

Detailed procedures of the hydrothermal process for producing different types of titanium dioxide can be varied by one skilled in the art to produce powders of titanium dioxide nanoparticles having a diameter of 15-20 nm, powders of titanium dioxide nanospheres having a diameter of 200-500 nm, and powders of titanium dioxide nanotubes having a length of 300-800 nm. An example of the hydrothermal process is set forth below without any limitative purposes.

(NP20 Having a Particle Diameter of 15-20 nm)

54 ml of 0.1 M aqueous solution of nitric acid was mixed with 9 ml of titanium isopropoxide and stirred vigorously for 30 minutes. The mixture was heated to 85-90° C. and then kept stirring while maintaining the temperature for 8 hours. The mixture was cooled to the room temperature and then heated at 220° C. for 12 hours (the hydrothermal reaction). After cooling and baking, nanoparticles of NP20 having a diameter of about 15-18 nm (shown in FIG. 3A) were obtained.

(NT Having a Tube Length of 300-800 nm)

The above nanoparticles of NP20 and solid sodium hydroxide (having a weight ratio about 1:12) were added into deionized water (30 ml/g) and stirred continuously. Heating circumfluence was carried out at 110° C. for 48 hours. After cooling, acid washing was carried out until the aqueous solution became acidic and a portion of solid powders deposited. After continuous immersion and cleaned with deionized water to make the aqueous solution become neutral, cooling and baking were conducted. High temperature calcination was carried out at 450° C. for 30 minutes to obtain crystal type titanium dioxide nanotubes of anatase, with the titanium dioxide nanotubes having a length about 400-800 nm and having a single-layer tube wall (see the NT nanotubes shown in FIG. 3C), with the titanium dioxide nanotubes having an outer diameter of about 16.0 nm and an inner diameter of about 6.0 nm.

(NS20 Having a Particle Diameter of 200-500 nm)

0.4 ml of 0.1M aqueous solution of potassium chloride was mixed with 100 ml of alcohol and then mixed with 2.5 ml of titanium isopropoxide. A catalyst was used to control the hydrolysis rate of titanium isopropoxide. The mixture was continuously stirred at room temperature for 10 minutes and placed still for 24 hours to stop aging of crystalline grains and to obtain white deposits. After cleaning, cooling, and baking, nanospheres of NS having a diameter of about 135-243 nm (shown in FIG. 3B) were obtained.

To prove the dye-sensitized solar cells made from the photoelectrodes of the above example possess different photoelectric conversion efficiencies, dye-sensitized solar cells having different photoelectrodes were produced according to the methods known by persons skilled in the art. These methods for producing dye-sensitized solar cells can be appreciated by one having ordinary skill in the art, and detailed description of which is not set forth to avoid redundancy.

With reference to Table 1, the dye-sensitized solar cells made from the above NP20, NP20/NS, NP20/NT, NP20NS/NT, NP20/NT/NS, and NTNP20/NS photoelectrodes were radiated by a solar simulator, and a current-voltage generator was used to measure and digitize the current-voltage of each photoelectrode, wherein the light intensity of the solar simulator was 100 mW/cm$^2$ (i.e., a sun).

TABLE 1 photoelectric conversion efficiencies of examples and comparative examples

|  | $V_{oc}$ (V) | $J_{sc}$ (mA/cm$^2$) | F.F. | $\eta$ (%) |
|---|---|---|---|---|
| NP20 | 0.64 | 10.96 | 0.64 | 4.58 |
| NP20/NT | 0.66 | 14.0 | 0.63 | 5.96 |
| NP20/NS | 0.69 | 11.56 | 0.63 | 5.06 |
| NP20/NS/NT | 0.67 | 19.30 | 0.60 | 7.83 |
| NP20/NT/NS | 0.66 | 21.74 | 0.58 | 8.53 |
| NT/NP20/NS | 0.67 | 15.3 | 0.64 | 6.57 | wherein $V_{oc}$ is the open-circuit voltage, $J_{sc}$ is the current density, F.F. is the filling factor, and $\eta$ is the photoelectric conversion efficiency.

As can be seen from Table 1, the photoelectric conversion efficiency of the dye-sensitized solar cell including NP20 photoelectrode is only 4.58%. The photoelectric conversion efficiency of the dye-sensitized solar cell including NP20/NS or NP20/NT photoelectrode is only 5.06%-5.96%. The photoelectric conversion efficiencies of the dye-sensitized solar cells including NP20/NS/NT, NP20/NT/NS, and NT/NP20/NS photoelectrodes are higher than 6.57%. The photoelectric conversion efficiency of the dye-sensitized solar cell using NP20/NS/NT photoelectrode is 7.83%. The photoelectric conversion efficiency of the dye-sensitized solar cell using NP20/NT/NS photoelectrode is 8.53%.

In view of the foregoing, by using the photoelectrode, the photoelectric conversion efficiency of the dye-sensitized solar cell according to the present invention increases the power source utility rate, increases the carrier mobility, and inhibits generation of dark current, such that the photoelectric conversion efficiency is significantly increased. Furthermore, the method for producing the photoelectrode of a dye-sensitized solar cell according to the present invention can continuously produce different types of titanium dioxide powders by the hydrothermal process for subsequent production of the photoelectrode formed by stacking three different types of titanium dioxide, not only reducing the working hours and cost but simplifying the procedures to achieve continuous mass production. Further, by adding the binder during production, the film-forming property and adhesion of the paste are enhanced to increase the fitness between the films, and the dye can be fully absorbed by the porous films, maintaining the formation quality of the photoelectrode and increasing the photoelectric conversion efficiency.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A dye-sensitized solar cell comprising
a negative electrode;
a positive electrode;

a photoelectrode mounted between the negative electrode and the positive electrode, with the photoelectrode adapted to absorb a dye, with the photoelectrode including a dense layer, a scattering layer and a carrier transport layer, with the dense layer, the scattering layer and the carrier transport layer stacked one upon another, with the dense layer having a thickness of 3-6 μm and formed by titanium dioxide nanoparticles having a diameter of 15-20 nm, with the scattering layer having a thickness of 8-11 μm and formed by titanium dioxide nanospheres having a diameter of 200-500 nm, and with the carrier transport layer having a thickness of 5-8 μm and formed by titanium dioxide nanotubes having a length of 300-800 nm; and an electrolyte located between the photoelectrode and the positive electrode.

2. The dye-sensitized solar cell as claimed in claim 1, wherein the scattering layer is located between the dense layer and the carrier transport layer, and wherein the dense layer is located on the negative electrode.

3. The dye-sensitized solar cell as claimed in claim 1, wherein the carrier transport layer is located between the dense layer and the scattering layer, and wherein the dense layer is located on the negative electrode.

4. A photoelectrode for a dye-sensitized solar cell, with the photoelectrode comprising a dense layer, a scattering layer and a carrier transport layer, with the dense layer, the scattering layer and the carrier transport layer stacked one upon another, with the dense layer having a thickness of 3-6 μm and formed by titanium dioxide nanoparticles having a diameter of 15-20 nm, with the scattering layer having a thickness of 8-11 μm and formed by titanium dioxide nanospheres having a diameter of 200-500 nm, and with the carrier transport layer having a thickness of 5-8 μm and formed by titanium dioxide nanotubes having a length of 300-800 nm.

5. The photoelectrode for a dye-sensitized solar cell as claimed in claim 4, wherein the scattering layer is located between the dense layer and the carrier transport layer.

6. The photoelectrode for a dye-sensitized solar cell as claimed in claim 4, wherein the carrier transport layer is located between the dense layer and the scattering layer.

7. A method for producing a photoelectrode for a dye-sensitized solar cell, with the method comprising:

respectively mixing powders of titanium dioxide nanoparticles having a diameter of 15-20 nm, powders of titanium dioxide nanospheres having a diameter of 200-500 nm, and powders of titanium dioxide nanotubes having a length of 300-800 nm in a solvent;

adding a binder into the solvent to make the powders of titanium dioxide nanoparticles, the powders of titanium dioxide nanospheres, and the powders of titanium dioxide nanotubes respectively and homogenously mix with the solvent, forming a particle-shaped paste, a ball-shaped paste, and a tube-shaped paste, respectively;

forming a dense layer, a scattering layer and a carrier transport layer with the particle-shaped paste, the sphere-shaped paste and the tube-shaped paste, respectively; and stacking the dense layer, the scattering layer and the carrier transport layer on a substrate to form a photoelectrode, wherein the dense layer has a thickness of 3-6 μm, the scattering layer has a thickness of 8-11 μm, and the carrier transport layer has a thickness of 5-8 μm.

8. The method for producing a photoelectrode for a dye-sensitized solar cell as claimed in claim 7, wherein the binder is polyethylene glycol.

9. The method for producing a photoelectrode for a dye-sensitized solar cell as claimed in claim 8, wherein a weight percentage of the polyethylene glycol is 40% of one of the powders of titanium dioxide nanoparticles, the powders of titanium dioxide nanoballs, and the powders of titanium dioxide nanotubes.

10. The method for producing a photoelectrode for a dye-sensitized solar cell as claimed in claim 7, further comprising making the powders of titanium dioxide nanoparticles having a diameter of 15-20 nm, the powders of titanium dioxide nanospheres having a diameter of 200-500 nm, and the powders of titanium dioxide nanotubes having length of 300-800 nm by a hydrothermal process.

11. The method for producing a photoelectrode for a dye-sensitized solar cell as claimed in claim 7, wherein the stacking step comprises stacking the dense layer, the scattering layer and the carrier transport layer on the substrate by a doctor blade method.

* * * * *